US012621960B2

(12) United States Patent
Hsu et al.

(10) Patent No.: US 12,621,960 B2
(45) Date of Patent: May 5, 2026

(54) HEAT DISSIPATION SYSTEM AND METHOD FOR ELECTRONIC DEVICES

(71) Applicant: Lenovo Enterprise Solutions (Singapore) Pte. Ltd., Singapore (SG)

(72) Inventors: Fwu-Bin Hsu, Singapore (SG); Jeffrey Holland, Singapore (SG); Vinod Kamath, Singapore (SG); Wen-Lung Wang, Singapore (SG); Cheng-Yao Cheng, Singapore (SG); Chih-Lynn Yeh, Singapore (SG)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 121 days.

(21) Appl. No.: 18/407,746

(22) Filed: Jan. 9, 2024

(65) Prior Publication Data

US 2024/0292567 A1    Aug. 29, 2024

(30) Foreign Application Priority Data

Feb. 24, 2023    (CN) .......................... 202310164974.2

(51) Int. Cl.
*H05K 7/20* (2006.01)

(52) U.S. Cl.
CPC ..... *H05K 7/20281* (2013.01); *H05K 7/20272* (2013.01); *H05K 7/20836* (2013.01)

(58) Field of Classification Search
CPC ........... H05K 7/20836; H05K 7/20272; H05K 7/20281
See application file for complete search history.

(56) References Cited

U.S. PATENT DOCUMENTS

| | | | | |
|---|---|---|---|---|
| 2011/0290448 | A1* | 12/2011 | Campbell | .......... H05K 7/20318 165/181 |
| 2017/0295677 | A1* | 10/2017 | Shelnutt | ............. H05K 7/20836 |
| 2024/0147673 | A1* | 5/2024 | Chen | .................. H05K 7/20281 |

\* cited by examiner

*Primary Examiner* — Eric S Ruppert
(74) *Attorney, Agent, or Firm* — ANOVA LAW GROUP, PLLC

(57) ABSTRACT

The present application provides a heat dissipation system and method for electronic devices. The system includes a heat dissipation unit attached to electronic component of an electronic device, a temperature and humidity sensor, a cooling unit and a controller. The controller is configured to obtain the dew point temperature of the space in which the cooling unit is disposed and to determine a coolant flow rate based on the dew point and the coolant temperature. In the event where the difference between the coolant temperature and the dew point is greater than a threshold, the heat dissipation unit receives the coolant under a first flow rate. In the event where the difference between the coolant temperature and the dew point is equal to or less than the threshold, the heat dissipation unit receives the coolant under a second flow rate lower than the first flow rate.

20 Claims, 3 Drawing Sheets

HEAT DISSIPATION SYSTEM AND METHOD FOR ELECTRONIC DEVICES

CROSS-REFERENCE TO RELATED APPLICATION

The present disclosure claims priority to Chinese Patent Application No. 202310164974.2, filed on Feb. 24, 2023, the entire content of which is incorporated herein by reference.

TECHNICAL FIELD

The present application related to heat dissipation system and method for electronic devices and in particular, to a water-cooling heat dissipation system and method for electronic devices.

BACKGROUND

Heat dissipation to heating elements in electronic devices, for instance computing devices, computer servers, etc, are necessary for maintaining the normal operations of such devices. High heat-generating components, such as central processing units (CPU) in large scale and high performance computing devices, generates heats at a level much higher than those from small computing devices and micro computers and accordingly, such components have high level of heat dissipation requirements. One type of heat dissipation system of such type, operates with liquid, for example water, as heat transfer media, to provide heat dissipation with high capacity. In one aspect, water temperature in such system is expected to be as lower as possible, to meet heat dissipation requirements. In another aspect, however, condense water may be generated with relatively low water temperature, which may give rise to malfunctions or even damages to the computing system.

Water temperature adjustment by manual control is often used to reduce the likelihood of condense water generation. Such method, however, requires real time monitoring on computing systems and devices, which is time consuming and labor intensive and further, precision control of condense water generation at the effective heat dissipation is hard to achieve.

SUMMARY

According to one embodiment, a heat dissipation system for electronic devices comprises a heat dissipation unit thermal exchangeably attached to a heat-generating component of an electronic device, a temperature and humidity sensor disposed in a space in which the heat dissipation unit and the heat-generating component are disposed, and a cooling device in fluid communication with and configured to supply coolant to the heat dissipation unit. The controller is configured to obtaining a dew point temperature based on a temperature and a humidity measured in the space, and to configure flow rate based on the temperature of the coolant and the dew point temperature, causing the heat dissipation unit to receive coolant under a first flow rate when a difference between the coolant temperature and the dew point is greater than a predetermined threshold, or causing the heat dissipation unit to receive coolant under a lowered second flow rate when the difference between the coolant temperature and the dew point is equal to or less than a predetermined threshold.

According to another embodiment, the present application provides heat dissipation method for electronic devices, the method comprises supplying a coolant to a heat dissipation unit under a first flow rate; determining a dew point temperature of a space in which the heat dissipation unit is disposed; determining a temperature difference between a coolant temperature and the dew point temperature; supplying the coolant to the heat dissipation unit under the first flow rate when the temperature difference is greater than a predetermined threshold, or lowering the first flow rate to a second flow rate and supplying the coolant to the heat dissipation unit under the second first flow rate when the temperature difference is equal to or less than the predetermined threshold.

BRIEF DESCRIPTION OF DRAWINGS

Technical solutions embodied herein will be illustrated in further detail in junction with the drawings, in which.

DETAILED DESCRIPTION

Figures 1, 2:
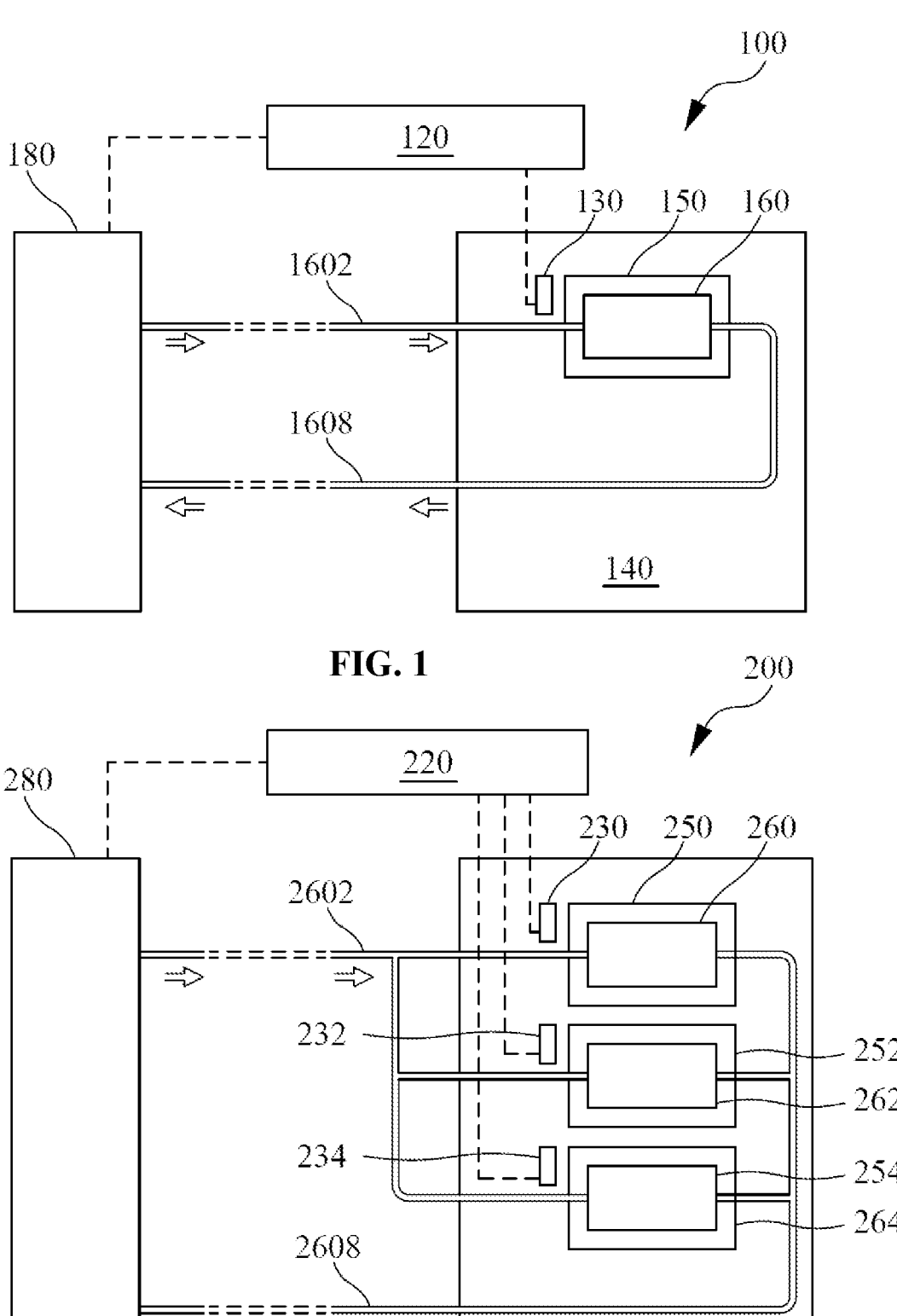
FIG. 1 is a block diagram of a heat dissipation system for a computing device according to one embodiment.
FIG. 2 is a block diagram of a heat dissipation system for a computing device according to another embodiment.

As shown in FIG. 1, according to one embodiment, a heat dissipation system 100 for a computing device comprises a heat dissipation unit, for instance heat sink 160, supply pipe 1602 and return pipe 1608 connected in fluid communication with the heat sink 160, and a cooling device such as a cooling distribution unit (CDU) 180 in fluid communication with the supply pipe 1602 and return pipe 1608, a temperature-humidity sensor 130 and a controller 120.

Heat sink 160 is mounted to an electrical component 150, for dissipating heat from the electrical component 150 via heat exchange with the electrical component 150. Electronic device 140 may be e.g. computer server, located in an environment such as a server room of a data center. The electronic component 150 includes various types of functional components of the electronic device 140, e.g. central processing unit (CPU) which, generates heat during the operation of the electronic device 140. Heat sink 160 therefore works to dissipate heat from the electronic component, to maintain normal operation of the electronic device.

CDU 180 may be located in a room or place next to but separated from the computer room. CDU 180 and heat sink 160 form a closed liquid circuit through the supply pipe 1602 and return pipe 1608. Cooling liquid flows from the CDU 180 into the heat sink 160 through the supply pipe 1602, and flows from the heat sink 160 back to the CDU 180 through the return pipe 1608. The cooling liquid undergoes heat exchange between the heat sink 160 and the electrical component 150, to dissipate heat from the electrical component 150. The heated cooling liquid flowing out of the heat sink 160 flows back to the CDU 180. The cooling liquid re-cooled by the CDU 180 then flows to the heat sink 160 again and cyclically for continuous cooling for the electrical component.

Temperature and humidity sensor 130 is disposed in the surrounding environment of the electronic component 150, for measuring the temperature and humidity of the space in which the electronic component is disposed. The temperature and humidity measured is the environment temperature and humidity in the space in which the surface of the electronic component 160 and heat sink 160 are exposed.

The controller 120 may include e.g. data center management software, and configured to monitor and manage the components of the electronic device 140. The controller 120 is coupled to the sensor 130 and CDU 180. Controller 120 receives the temperature and humidity measurement data from the sensor 130, e.g. a real-time temperature and humidity data at a given moment, or temperature and humidity data or data series acquired at predetermined time intervals, and derive the dew point temperature of the space in which the electronic component 150 and the heat sink 160 are disposed, at the corresponding moment or a time interval. For example, the dew point temperature may be obtained according to the below formula based on Magnus-Tetens Approximation:

$$T_d = \frac{b\,\gamma(T,\,RH)}{a - \gamma(T,\,RH)} \qquad (1)$$

where Td denotes the dew point temperature, T and RH respectively denotes the temperature and relative humidity as measured, a and b are constant i.e. a=17.27, b=237.7° C., and $\gamma$(T,RH)=aT/(b+T)+ln(RH/100).

In the meantime, controller 120 monitors and obtains the flow rate and the temperature of the cooling liquid supplied by the CDU 180, and set the flow rate based on the dew point temperature, therefore to provide heat dissipation to the electronic component 150 without condense water being generated. For example, upon the electronic device being powered on and starting operation, the controller 120 sets the cooling liquid to flow from the CDU 180 at a first flow rate. Based on the temperature and humidity data measured by the sensor 130, the controller 120 derives the dew point temperature of the space in which the electronic component 150 and heat sink 160 are disposed, and obtains the temperature difference between the dew point temperature and the temperature of the cooling liquid before arriving at the heat sink 160.

Under normal operation of the electronic device 140, the temperature of the cooling liquid before arriving at the heat sink 160 is set to be higher than the dew point temperature and accordingly, there is no condense water generated on the heat sink 160 and the electronic component 150. The controller 120 is configured to control the CDU 180 to supply cooling liquid to the heat sink 160 at a first flow rate, when the temperature difference between the dew point temperature and the temperature of the cooling liquid is higher than the dew point temperature, to conduct heat dissipation for the electronic component 150.

In situations where the dew point temperature increases, due to the change of the temperature and humidity at the space in which the heat sink 160 and the electronic component 150 are disposed, the temperature difference between the dew point and the temperature of the cooling liquid before arriving at the heat sink 160 reduces accordingly. When the temperature difference is equal to or less than the predetermined threshold, the controller 120 reduces the first flow rate to a second flow rate, so that the CDU 180 supplies cooling liquid to the heat sink 160 under the second flow rate, which is lower than the first flow rate. In some embodiments, the controller 120 may also be configured to activate an alert upon the temperature difference being detected to be equal to or less than the threshold, notifying that condense water may be generated.

The predetermined threshold may be determined based on the heat dissipation requirements of the electronic device 140 and the electronic components 150, and the configuration requirements, specification and heat dissipation characteristics of the heat sink 160. For example, the predetermined threshold may be determined as a certain value beyond which the difference between the cooling liquid temperature over the dew point is greater enough to avoid generation of condense water on the surfaces of the electronic device 140, the electronic components 150 and the heat sink 160. Alternatively or additionally, the predetermined threshold may be determined at the value as defined above and plus a buffer range, to further reduce the risk of condense water generation.

Cooling liquid at the relatively lowered second flow rate accordingly reduces the heat dissipation effect of the heat sink 160, which reduces the heat dissipated from the electronic component 150 through the heat sink 160 and accordingly, the temperature of the electronic component 150, the heat sink 160 and the surrounding space thereof increases. Condense water is therefore effectively avoided and normal operation of the electric device 140 maintained. When the temperature difference exceeds the predetermined threshold, the controller 120 causes the CDU 180 to resume the cooling liquid supply at the higher flow rate, i.e. at the first flow rate, and heat dissipation efficiency improved.

In another embodiment, as shown in FIG. 2, a heat dissipation system 200 comprises a plurality of heat dissipation units, for instance heat sinks 260, 262 and 264, supply pipe 2602 and return pipe 2608 connected in fluid communication with the heat sinks 260, 262 and 264, and a cooling device such as a cooling distribution unit (CDU) 280 in fluid communication with the supply pipe 2602 and return pipe 2608, temperature-humidity sensors 230, 232 and 234 and a controller 220.

Heat sinks 260, 262 and 264 are mounted to respective electrical components 250, 252, 254, for dissipating heat from the respective electrical components 250, 252 and 254, via heat exchange with the electrical components 250, 252 and 254. Electronic device 240 may be e.g. computer server, located in an environment such as a server room of a data center. The electronic components 250, 252 and 254 includes various types of functional components of the electronic device 240, e.g. central processing unit (CPU) which, generates heat during the operation of the electronic device 240. Heat sinks 260, 262 and 264 therefore work to dissipate heat from the electronic components, to maintain operation of the electronic device.

CDU 280 may be located in a room or place next to but separated from the computer room. CDU 280 and heat sinks 260, 262 and 264 form a closed liquid circuit through the supply pipe 2602 and return pipe 2608. Cooling liquid flows from the CDU 280 into the heat sinks 260, 262 and 264 through the supply pipe 2602, and flows from the heat sinks 260, 262 and 264 back to the CDU 280 through the return pipe 2608. The cooling liquid undergoes heat exchange between the heat sinks 260, 262 and 264 and the electrical components 250, 252 and 254, to dissipate heat from the respective electrical components 250, 252 and 254. The heated cooling liquid flowing out of the heat sinks 260, 262 and 264 flow back to the CDU 280. The cooling liquid re-cooled by the CDU 280 then flows to the heat sinks 260, 262 and 264 again and cyclically for continuous cooling for the electrical components.

Temperature and humidity sensors 230, 232 and 234 are disposed in the surrounding environment of the electronic components 250, 252 and 254, for measuring the temperature and humidity of the space in which the respective electronic components are disposed.

The controller 220 may include e.g. data center management software, and configured to monitor and manage the components of the electronic device 240. The controller 220 is coupled to the sensors 230, 232, 234 and CDU 280. Controller 220 receives the temperature and humidity measurement data form the sensors 230, 232 and 234, e.g., a real-time temperature and humidity data at a given moment, or temperature and humidity data or data series acquired at predetermined time intervals, and derive the dew point temperature of the space in which the electronic components 250, 252, 254 and the heat sinks 260, 262 and 264 are disposed, at the corresponding moment or time interval, and obtain the dew point temperature based on formula (1) depicted above.

In the meantime, controller 220 monitors and obtains the flow rate and the temperature of the cooling liquid supplied by the CDU 280, and set the flow rate based on the dew point temperature, therefore to provide heat dissipation to the electronic components 250, 252 and 254 without condense water being generated. For example, upon the electronic device being powered on and starting operation, the controller 220 sets the cooling liquid to flow from the CDU 280 to the heat sinks 260, 262 and 264 in a first flow rate. Based on the temperature and humidity data measured by the sensor 230, the controller 220 derives the dew point temperature of the space in which the electronic components 250, 252 and 254 and heat sinks 260, 262 and 264 are disposed, and obtains the temperature difference between the dew point temperature and the temperature of the cooling liquid before arriving the heat sinks 260, 262 and 264. Further, in situations where the dew point temperatures derived from temperature and humidity data measured by the sensors 230, 232 and 234 vary, which leads to variant temperature differences being determined, the controller 280 may choose the minimum value of the temperature differences as the basis for comparison with the predetermined threshold.

Under normal operation of the electronic device 240, the temperature of the cooling liquid before arriving at the heat sinks 260, 262 and 264 are set to be all higher than the dew point temperature and accordingly, there is no condense water generated on the heat sinks 260, 262, 264 and the electronic component 250. The controller 220 is configured to control the CDU 280 to supply cooling liquid to the heat sinks 260, 262 and 264 at the first flow rate, when the minimum temperature difference between the dew point temperature and the temperature of the cooling liquid is higher than the dew point temperature, to conduct heat dissipation for the electronic components 250, 252 and 254.

In situations where the dew point temperature increases, due to the change of the temperature and humidity at the space in which the heat sinks 260, 262 and 264 and the electronic component 250 are disposed, the temperature difference between each dew point and the temperature of the cooling liquid before arriving at the heat sinks 260, 262 and 264 reduces accordingly. When the minimum temperature difference is equal to or less than the predetermined threshold, the controller 220 reduces the first flow rate to a second flow rate, so that the CDU 280 supplies cooling liquid to the heat sinks 260, 262 and 264 under the second flow rate, which is lower than the first flow rate.

The predetermined threshold may be determined based on the heat dissipation requirements of the electronic device 240 and the electronic components 250, and the configuration requirements, specification and heat dissipation characteristics of the heat sinks 260, 262 and 264. For example, the predetermined threshold may be determined as a certain value beyond which the difference between the cooling liquid temperature over the dew point is greater enough to avoid generation of condense water on the surfaces of the electronic device 240, the electronic components 250, 252, 254 and the heat sinks 260, 262 and 264. Alternatively or additionally, the predetermined threshold may be determined at the value as defined above and plus a buffer range, to further reduce the risk of condense water generation.

Cooling liquid at the relatively lowered second flow rate accordingly reduced the effect of heat dissipation on the heat sinks 260, 262 and 264, which reduces the heat dissipated from the electronic component 250 through the heat sinks 260, 262 and 264 and accordingly, the temperature of the electronic components 250, 252, 254, the heat sinks 260, 262, 264 and the surrounding space thereof increases. Condense water is therefore effectively avoided and normal operation of the electric device 240 maintained. When the temperature difference exceeds the predetermined threshold, the controller 220 causes the CDU 280 to resume the cooling liquid supply at the higher flow rate, i.e. at the first flow rate and heat dissipation efficiency improved.

Figure 3:
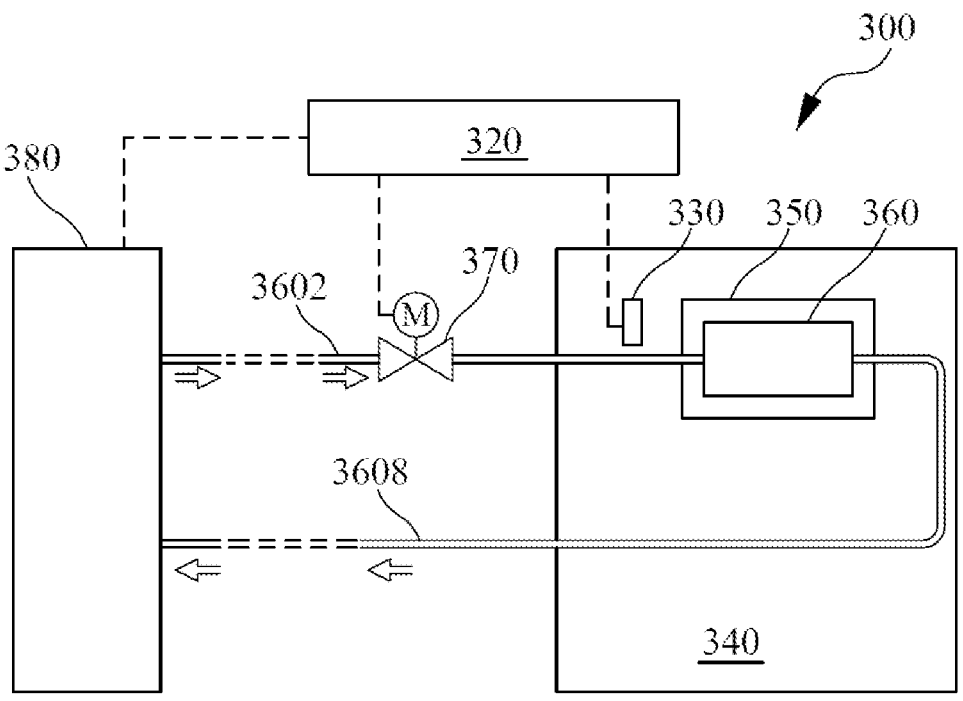
FIG. 3 is a block diagram of a heat dissipation system for a computing device according to yet another embodiment.

As shown in FIG. 3, according to yet another embodiment, a heat dissipation system 300 for a computing device comprises a heat dissipation unit, for instance heat sink 160, supply pipe 3602 and return pipe 3608 connected in fluid communication with the heat sink 360, a flow valve 370 connected between the supply pipe 3602 and the heat sink 360, a cooling device such as a cooling distribution unit (CDU) 380 in fluid communication with the supply pipe 3602 and return pipe 3608, a temperature-humidity sensor 330 and a controller 320.

Heat sink 360 is mounted to an electrical component 350, for dissipating heat from the electrical component 350 via heat exchange with the electrical component 350. Electronic device 340 may be e.g. computer server, located in an environment such as a server room of a data center. The electronic component 350 includes various types of functional components of the electronic device 340, e.g. central processing unit (CPU), which, generates heat during the operation of the electronic device 340. Heat sink 360 therefore works to dissipate heat from the electronic component, to maintain normal operation of the electronic device.

CDU 380 may be located in a room or place next to but separated from the computer room. CDU 380 and heat sink 360 form a closed liquid circuit through the supply pipe 3602 and return pipe 3608. Cooling liquid flows from the CDU 180 into the heat sink 360 through the supply pipe 3602 and flow valve 370. The cooling liquid undergoes heat exchange between the heat sink 360 and the electrical component 350, to dissipate heat from the electrical component 350. The heated cooling liquid flowing out of the heat sink 360 flows back to the CDU 380. The cooling liquid re-cooled by the CDU 380 then flows to the heat sink 360 again and cyclically for continuous cooling for the electrical component.

Temperature and humidity sensor 330 is disposed in the surrounding environment of the electronic component 350, for measuring the temperature and humidity of the space in which the electronic component is disposed.

The controller 320 may include e.g. a system management module or like device, and configured to monitor and manage the components of the electronic device 340. The controller 320 is coupled to the sensor 130 and the flow valve 370 and optionally coupled to the CDU 380. Controller 320 receives the temperature and humidity measurement data from the sensor 330, e.g. a real-time temperature and humidity data at a given moment, or temperature and humidity data or data series acquired at predetermined time intervals, and derive the dew point temperature of the space in which the electronic component 350 and the heat sink 360 are disposed, at the corresponding moment or time interval, based on formula (1) depicted above.

In the meantime, controller 320 monitors and obtains the flow rate and the temperature of the cooling liquid to be supplied by the CDU 380, and set the flow rate with the flow valve 370 of the cooling liquid supplied by the CDU 380 under constant flow rate and based on the dew point temperature, to provide heat dissipation to the electronic component 350 without condense water being generated. For example, upon the electronic device being powered on and starting operation, the CDU 380 may set independently or through the controller 320 set the cooling liquid to flow from the CDU 380 at a first flow rate, therefore to provide heat dissipation to the electronic component 350 without condense water being generated. For example, upon the electronic device being powered on and starting operation, the controller 320 sets the cooling liquid to flow from the CDU 380 at a first flow rate. Based on the temperature and humidity data measured by the sensor 330, the controller 320 derives the dew point temperature of the space in which the electronic component 350 and heat sink 360 are disposed, and obtains the temperature difference between the dew point temperature and the temperature of the cooling liquid before arriving at the heat sink 360.

Under normal operation of the electronic device 340, the temperature of the cooling liquid before arriving at the heat sink 360 is set to be higher than the dew point temperature and accordingly, there is no condense water generated on the heat sink 360 and the electronic component 350. When the temperature difference is maintained at a level greater than the predetermined threshold, CDU 380 supplies cooling liquid at the first flow rate to the heat sink 360, by the CDU 380 self control or under the control of controller 320, to conduct heat dissipation to the electronic component 350.

In situations where the dew point temperature increases, due to the change of the temperature and humidity at the space in which the heat sink 360 and the electronic component 350 are disposed, the temperature difference between the dew point and the temperature of the cooling liquid before arriving at the heat sink 360 reduces accordingly. When the temperature difference is equal to or less than the predetermined threshold, the controller 320 reduces the first flow rate to a second flow rate, so that the CDU 380 supplies cooling liquid to the heat sink 360 under the second flow rate, which is lower than the first flow rate.

The predetermined threshold may be determined based on the heat dissipation requirements of the electronic device 340 and the electronic components 350, and the configuration requirements, specification and heat dissipation characteristics of the heat sink 360, as well as the configuration parameters of the flow valve 370. For example, the predetermined threshold may be determined as a certain value beyond which the difference between the cooling liquid temperature over the dew point is greater enough to avoid generation of condense water on the surfaces of the electronic device 340, the electronic components 350 and the heat sink 360. Alternatively or additionally, the predetermined threshold may be determined at the value as defined above plus a buffer range, to further reduce the risk of condense water generation.

Cooling liquid at the relatively lowered second flow rate as received by the heat sink 360 accordingly reduces the heat dissipation effect of the heat sink 160, which reduces the heat dissipated from the electronic component 150 through the heat sink 160 and therefore, the temperature of the electronic component 150, the heat sink 160 and the surrounding space thereof increases. Condense water is therefore effectively avoided and normal operation of the electric device 140 maintained. When the temperature difference exceeds the predetermined threshold, the controller 120 causes the CDU 180 to resume the cooling liquid supply at the higher flow rate, i.e. the first flow rate and heat dissipation efficiency improved.

Figure 4:
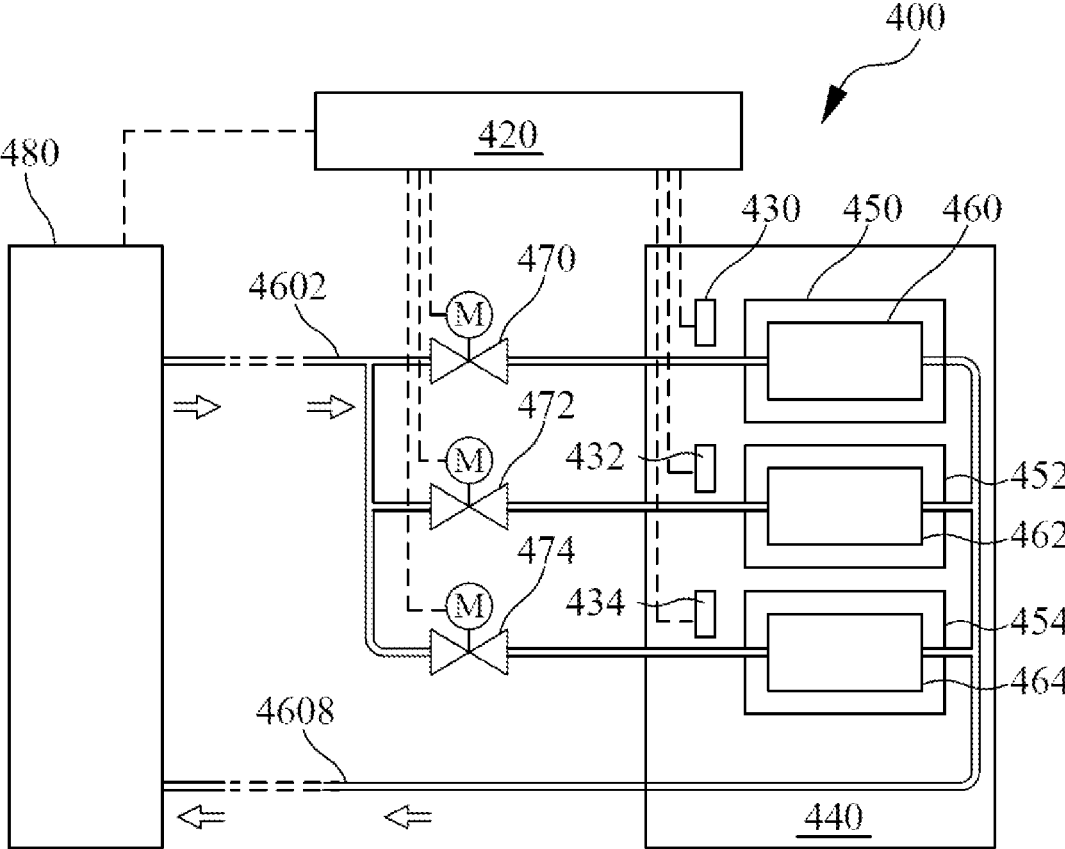
FIG. 4 is a block diagram of a heat dissipation system for a computing device according to a further embodiment.

In a further embodiment, as shown in FIG. 4, a heat dissipation system 400 comprises a plurality of heat dissipation units, for instance heat sinks 460, 462 and 464, supply pipe 4602 and return pipe 4608 connected in fluid communication with the heat sinks 460, 462 and 464, flow valves 470, 472 and 474 connected between the supply pipe 4602 and the respective heat sinks 460, 462 and 464, a CDU 480 in fluid communication with the supply pipe 4602 and return pipe 4608, temperature-humidity sensors 430, 432 and 434 and a controller 420.

Heat sinks 460, 462 and 464 are mounted to respective electrical components 250, 252, 254, for dissipating heat from the respective electrical components 250, 252 and 254, via heat exchange with the electrical components 250, 252 and 254. Electronic device 240 may be e.g. computer server, located in an environment such as a server room of a data center. The electronic components 250, 252 and 254 includes various types of functional components of the electronic device 240, e.g. central processing unit (CPU), which, generates heat during the operation of the electronic device 240. Heat sinks 260, 262 and 264 therefore work to dissipate heat from the electronic components, to maintain operation of the electronic device.

CDU 480 may be located in a room or place next to but separated from the computer room. CDU 480 and heat sinks 460, 462 and 464 form a closed liquid circuit through the supply pipe 4602, the flow valves 470, 472, 474 and return pipe 4608. Cooling liquid flows from the CDU 480 into the heat sinks 460, 462 and 464 through the supply pipe 4602, and flows from the heat sinks 460, 462 and 264 back to the CDU 480 through the return pipe 4608. The cooling liquid undergoes heat exchange between the heat sinks 460, 462 and 464 and the electrical components 450, 452 and 454, to dissipate heat from the respective electrical components 450, 452 and 454. The heated cooling liquid flowing out of the heat sinks 460, 462 and 464 flow back to the CDU 480. The cooling liquid re-cooled by the CDU 480 then flows to the heat sinks 460, 462 and 464 again and cyclically for continuous cooling for the electrical components.

Temperature and humidity sensors 430, 432 and 434 are disposed in the surrounding environment of the electronic components 450, 452 and 454, for measuring the temperature and humidity of the space in which the respective electronic components are disposed.

The controller 420 may include e.g. system management module of like device, and configured to monitor and manage the components of the electronic device 440. The controller 420 is coupled to the sensors 430, 432, 434 and CDU 480. Controller 420 receives the temperature and humidity measurement data form the sensors 430, 432 and 434, e.g., a real-time temperature and humidity data at a given moment, or temperature and humidity data or data series acquired at predetermined time intervals, and derive the dew point temperature of the space in which the electronic components 450, 452, 454 and the heat sinks 460, 462 and 464 are disposed, at the corresponding moment or time interval, and obtain the dew point temperature based on formula (1) depicted above.

In the meantime, controller 420 monitors and obtains the flow rate and the temperature of the cooling liquid to be supplied by the CDU 480, and set the flow rate independently with the respective flow valves 470, 472 and 474 of the cooling liquid supplied by the CDU 480 under constant flow rate and based on the dew point temperature, to provide heat dissipation to the electronic components 250, 252 and 254 without condense water being generated. For example, upon the electronic device being powered on and starting operation, the controller 420 sets the cooling liquid to flow from the CDU 480 to the heat sinks 460, 462 and 464 in a first flow rate. Based on the temperature and humidity data measured by the sensor 430, the controller 420 derives the dew point temperature of the space in which the electronic components 450, 452 and 454 and heat sinks 460, 462 and 464 are disposed, and obtains the temperature difference between the dew point temperature and the temperature of the cooling liquid before arriving the heat sinks 460, 462 and 464. In situations where the dew point temperatures derived from temperature and humidity data measured by the sensors 430, 432 and 434 vary, which lead to variant temperature differences being determined, the controller 480 may tune the flow rate of the cooling liquid supplied to each heat sink 460, 462 and 464 through respective flow valves 470, 463 and 474.

Under normal operation of the electronic device 440, the temperature of the cooling liquid before arriving at the heat sinks 460, 462 and 464 are set to be all higher than the dew point temperature and accordingly, there is no condense water generated on the heat sinks 460, 462, 464 and the electronic component 450. When all the temperature differences are maintained at a level greater than the predetermined threshold, the CDU 480 under self control or being controlled by the controller 420 to supply cooling liquid to the heat sinks 460, 462 and 464 at the first flow rate, to conduct heat dissipation for the electronic components 450, 452 and 454.

In situations where the dew point temperature increases, due to the change of the temperature and humidity at the space in which the heat sinks 460, 462 and 464 and the electronic component 450 are disposed, the temperature difference between each dew point and the temperature of the cooling liquid before arriving at the heat sinks 460, 462 and 464 reduces accordingly. When each temperature difference is equal to or lower than the predetermined threshold, and without the flow rate of the cooling liquid supplied from the CDU being varied, the controller 420 tunes the first flow rate of the cooling liquid supplied to each respective heat sink 460, 462 and 464 independently to a respective second flow rate, such that each respective heat sink 460, 462 and 464 receives the cooling liquid at a lowered second flow rate.

The predetermined threshold may be determined based on the heat dissipation requirements of the electronic device 440 and the electronic components 450, and the configuration requirements, specification and heat dissipation characteristics of the heat sinks 460, 462 and 464. For example, the predetermined threshold may be determined as a certain value beyond which the difference between the cooling liquid temperature over the dew point is greater enough to avoid generation of condense water on the surfaces of the electronic device 440, the electronic components 450, 452, 454 and the heat sinks 460, 462 and 464. Alternatively or additionally, the predetermined threshold may be determined at the value as defined above and plus a buffer range, to further reduce the risk of condense water generation.

Cooling liquid at the relatively lowered second flow rate accordingly reduced the effect of heat dissipation on the heat sinks 460, 462 and 464, which reduces the heat dissipated from the electronic component 450 through the heat sinks 460, 462 and 464 and accordingly, the temperature of the electronic components 450, 452, 454, the heat sinks 460, 462, 464 and the surrounding space thereof increases. Condense water is therefore effectively avoided and normal operation of the electric device 440 maintained. When the temperature difference exceeds the predetermined threshold, the controller 420 causes the CDU 480 to resume the cooling liquid supply at the higher flow rate, i.e. at the first flow rate and heat dissipation efficiency improved.

Controller 420 is configured to independently control each flow valve 470, 472 and 474, based on the dew point temperature of the space surrounding each heat sink 460, 462 and 464, and the heat dissipation requirement of each respective electronic component 450, 452 and 454. For example, in situations where the dew point temperatures are different from each other, each flow valve 470, 472 and 474 may tune the constant first flow rate supplied from the CDU 480 into respect second flow rate at different level, to supply the cooling liquid to each respective heat sink 460, 462 and 464 at each respective second flow rate. Accordingly, optimized heat dissipation can be achieved at each electronic device 450, 452 and 454 with condense water being effectively avoided. Further, in the event where the temperature difference increases to a level higher than the predetermined threshold, the controller 420 may tune the flow valve 470 to supply cooling liquid under the higher first flow rate, to increase the heat dissipation efficiency.

Figure 5:
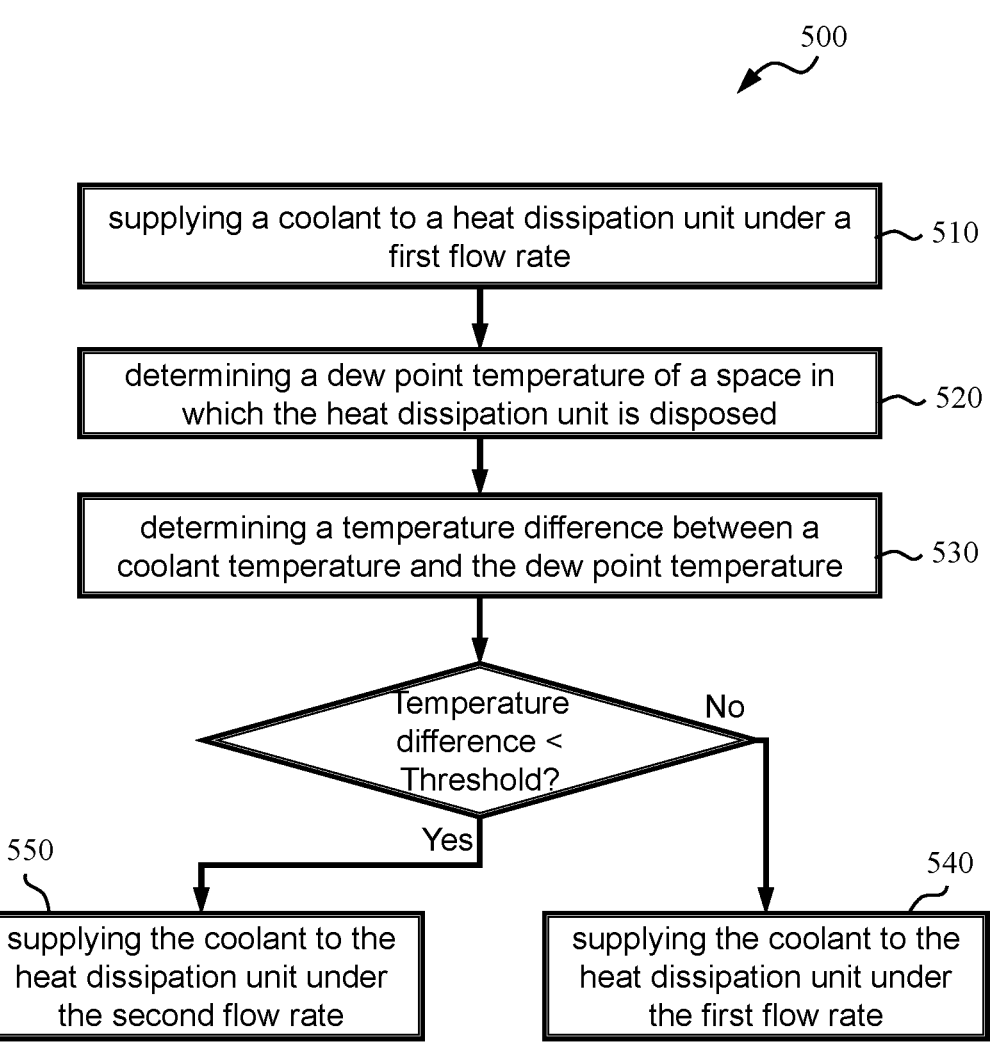
FIG. 5 is a flow chart of a heat dissipation method for a computing device according to one embodiment.

As shown in FIG. 5, a heat dissipation method 500 for electronic device comprises, at step 510, supplying a coolant to a heat dissipation unit under a first flow rate, at step 520, determining a dew point temperature of a space in which the heat dissipation unit is disposed and at step 530, determining a temperature difference between a coolant temperature and the dew point temperature. When the temperature difference is greater than a predetermined threshold, the method includes a step 540 of supplying the coolant to the heat dissipation unit under the first flow rate. When the temperature difference is equal to or less than the predetermined threshold, the method includes step of 550 of lowering the first flow rate to a second flow rate and supplying the coolant to the heat dissipation unit under the second first flow rate.

Additionally, supplying the coolant under the second flow rate comprises supplying the coolant from the cooling unit to the heat dissipation unit.

Further, method 500 includes supplying the coolant to at least two heat dissipation units and determining a minimum temperature difference amongst the temperature differences between the coolant temperature and the at least two dew point temperatures. When the minimum temperature difference is greater than a predetermined threshold, the method includes supplying the coolant to the heat dissipation unit under the first flow rate. When the minimum temperature difference is equal to or less than the predetermined threshold, the method includes supplying the coolant to the at least two heat dissipation units under the second first flow rate.

Alternatively, supplying the coolant under the second flow rate comprises supplying the coolant from the cooling unit under the first flow rate, and reducing the first flow rate to the second flow rate between the cooling unit and heat dissipation unit.

Further, the method comprises supplying the coolant to at least two heat dissipation units, determining two dew point temperatures, and determining respective two temperature differences between the coolant temperature and a respective dew point temperature. When the temperature difference of each respective heat dissipation unit is greater than the predetermined threshold, the method comprises supplying coolant to each of the at least two heat dissipation units under the first flow rate. When the temperature difference of each respective heat dissipation unit is equal to or less than the predetermined threshold, the method comprises supplying coolant to each of the at least two heat dissipation units under the second flow rate.

What is claimed is:

1. A heat dissipation method comprising:
supplying a coolant to a heat dissipation unit under a first flow rate, the heat dissipation unit being attached to an electronic component of an electronic device;
determining a dew point temperature of a space in which the heat dissipation unit is disposed;
determining a temperature difference between a coolant temperature and the dew point temperature;
supplying the coolant to the heat dissipation unit under the first flow rate in response to the temperature difference being greater than a threshold; and
lowering the first flow rate to a second flow rate and supplying the coolant to the heat dissipation unit under the second flow rate in response to the temperature difference being equal to or less than the threshold;
wherein the threshold is determined based on heat dissipation requirements of the electronic device and the electronic component, and at least one of a configuration requirement, a specification, or a heat dissipation characteristic of the heat dissipation unit.

2. The method of claim 1, wherein supplying the coolant under the second flow rate comprises supplying the coolant from a cooling unit to the heat dissipation unit.

3. The method of claim 2,
wherein heat dissipation unit is one of at least two heat dissipation units;
the method further comprising:
determining a minimum temperature difference amongst temperature differences between the coolant temperature and dew point temperatures of the at least two heat dissipation units;
supplying the coolant to the at least two heat dissipation units under the first flow rate in response to the minimum temperature difference being greater than the threshold; and
supplying the coolant to the at least two heat dissipation units under the second flow rate in response to the minimum temperature difference being equal to or less than the threshold.

4. The method of claim 1, wherein supplying the coolant under the second flow rate comprises supplying the coolant from a cooling unit under the first flow rate, and reducing the first flow rate to the second flow rate.

5. The method of claim 4,
wherein the heat dissipation unit is one of at least two heat dissipation units,
the method further comprising:
determining a dew point temperature of each of the at least two heat dissipation units;

determining temperature differences between the coolant temperature and the dew point temperatures of the at least two heat dissipation units;
supplying the coolant to each of the at least two heat dissipation units under the first flow rate in response to the temperature difference between the coolant temperature and the dew point temperature of the each of the at least two heat dissipation units being greater than the threshold; and
supplying the coolant to each of the at least two heat dissipation units under a corresponding second flow rate of the each of the at least two heat dissipation units in response to the temperature difference between the coolant temperature and the dew point temperature of the each of the at least two heat dissipation units being equal to or less than the threshold.

6. The method of claim 5, wherein the corresponding second flow rate of the one of the at least two heat dissipation units is different from the corresponding second flow rate of another one of the at least two heat dissipation units.

7. The method of claim 1, further comprising activating an alert upon determining an occurrence in response to the temperature difference being equal to or less than the threshold.

8. A heat dissipation system comprising:
a heat dissipation unit attached to an electronic component of an electronic device;
a temperature and humidity sensor disposed in a space in which the heat dissipation unit and the electronic component are disposed;
a cooling device in fluid communication with and configured to supply coolant to the heat dissipation unit; and
a controller configured to perform the method according to claim 1.

9. The system of claim 8, wherein the controller is further configured to cause the cooling device to supply the coolant to the heat dissipation unit under the second flow rate in response to the difference between the coolant temperature and the dew point being equal to or less than the threshold.

10. The system of claim 9, comprising at least two heat dissipation units each being attached to a respective electronic component and at least two temperature and humidity sensors, each temperature and humidity sensor being disposed in a space surrounding a respective heat dissipation unit and a corresponding electronic component for measuring the temperature and the humidity of the space, wherein the controller is further configured to:
obtain a dew point temperature of each space based on the respective temperature and humidity as measured by the respective temperature and humidity sensor, and determine a minimum temperature difference amongst temperature differences between the coolant temperature and the dew point temperatures of the at least two heat dissipation units;
cause the at least two heat dissipation units to receive the coolant under the first flow rate in response to the minimum temperature difference being greater than the threshold; and
cause the at least two heat dissipation units to receive the coolant under the second flow rate in response to the minimum temperature difference being equal to or less than the threshold.

11. The system of claim 8, further comprising a flow rate valve in fluid communication between an outlet of the cooling device and an inlet of the heat dissipation unit and controllably coupled to the controller, wherein the controller is further configured to cause the coolant to be supplied from the flow rate valve to the heat dissipation unit under the first flow rate in response to the temperature difference being greater than the threshold, and cause the coolant to be supplied from the flow rate valve to the heat dissipation unit under the second flow rate in response to the temperature difference being equal to or less than the threshold.

12. The system of claim 11, comprising at least two heat dissipation units each being attached to and in thermal exchange with a respective electronic component, at least two temperature and humidity sensors each being disposed in a space surrounding a respective heat dissipation unit and a corresponding electronic component for measuring the temperature and the humidity of the space, and at least two flow rate valves each being in fluid communication between the cooling device and a respective heat dissipation unit and each being controllably coupled to the controller, wherein the controller is further configured to:

obtain a dew point temperature of each space based on the respective temperature and humidity as measured by the respective temperature and humidity sensor, and determine a temperature difference between the coolant temperature and each dew point temperature;

cause the heat dissipation unit to receive the coolant from a respective flow rate valve under the first flow rate in response to the temperature difference being greater than the threshold; and cause the heat dissipation unit to receive the coolant from a respective flow rate valve under the second flow rate in response to the temperature difference being equal to or less than the threshold.

13. The system of claim 12, wherein the at least two flow rate valves are independently controllable each for supplying the coolant under the second flow rate.

14. The system of claim 8, wherein the controller is further configured to activate an alert in response to the temperature difference being equal to or less than the threshold.

15. A non-transitory computer readable storage medium storing computer instructions, when executed by one or more processors, the computer instructions perform the heat dissipation method according to claim 8.

16. The non-transitory computer readable storage medium of claim 15, wherein the heat dissipation method further comprises supplying the coolant from a cooling unit to the heat dissipation unit.

17. The non-transitory computer readable storage medium of claim 16, wherein the heat dissipation method further comprises supplying the coolant to at least two heat dissipation units and determining a minimum temperature difference amongst temperature differences between the coolant temperature and dew point temperatures of the at least two heat dissipation units.

18. The non-transitory computer readable storage medium of claim 17, wherein the heat dissipation method further comprises:

supplying the coolant to the at least two heat dissipation units under the first flow rate in response to the minimum temperature difference being greater than the threshold; and supplying the coolant to the at least two heat dissipation units under the second flow rate in response to the minimum temperature difference being equal to or less than the threshold.

19. The non-transitory computer readable storage medium of claim 15, wherein the heat dissipation method further comprises supplying the coolant from a cooling unit under the first flow rate, and reducing the first flow rate to the second flow rate.

20. The non-transitory computer readable storage medium of claim 19, wherein the heat dissipation method further comprises supplying the coolant to at least two heat dissipation units, determining dew point temperatures of the at least two heat dissipation units, and determining temperature differences between the coolant temperature and each of the dew point temperatures.

* * * * *